(12) United States Patent
Malach et al.

(10) Patent No.: US 8,330,938 B2
(45) Date of Patent: Dec. 11, 2012

(54) SOLID-STATE ARRAY FOR LITHOGRAPHY ILLUMINATION

(75) Inventors: Joseph D Malach, Newark, NY (US); James Edson Webb, Fairport, NY (US)

(73) Assignee: Corning Incorporated, Corning, NY (US)

( * ) Notice: Subject to any disclaimer, the term of this patent is extended or adjusted under 35 U.S.C. 154(b) by 503 days.

(21) Appl. No.: 12/631,105

(22) Filed: Dec. 4, 2009

(65) Prior Publication Data
US 2010/0220306 A1  Sep. 2, 2010

Related U.S. Application Data

(60) Provisional application No. 61/156,038, filed on Feb. 27, 2009.

(51) Int. Cl.
G03B 27/54 (2006.01)
G03B 27/72 (2006.01)
G03B 27/32 (2006.01)

(52) U.S. Cl. .............. 355/70; 355/67; 355/77

(58) Field of Classification Search .......... 355/53, 355/67, 70, 69, 77; 250/553
See application file for complete search history.

(56) References Cited

U.S. PATENT DOCUMENTS

| 4,327,972 | A | 5/1982 | Brunsting |
|---|---|---|---|
| 4,370,026 | A | 1/1983 | Dubroeucq et al. |
| 4,769,750 | A | 9/1988 | Matsumoto et al. |
| 4,814,667 | A | 3/1989 | Tanaka |
| 5,675,401 | A | 10/1997 | Wangler et al. |
| 5,768,017 | A | 6/1998 | King et al. |
| 5,963,305 | A | 10/1999 | Mizouchi |
| 6,233,039 | B1 | 5/2001 | Yen et al. |
| 6,796,690 | B2 | 9/2004 | Bohlander |
| 7,012,270 | B2 | 3/2006 | Xu et al. |
| 7,061,583 | B2 | 6/2006 | Mulkens et al. |
| 7,133,118 | B2 | 11/2006 | Gui et al. |
| 7,298,553 | B2 | 11/2007 | Brenner |
| 7,434,939 | B2 | 10/2008 | Tajiri |
| 2004/0223199 | A1* | 11/2004 | Olszak .......................... 359/15 |
| 2005/0088735 | A1* | 4/2005 | Olszak .......................... 359/434 |
| 2005/0219493 | A1* | 10/2005 | Oshida et al. .................. 355/67 |
| 2005/0226000 | A1* | 10/2005 | Bader et al. .................. 362/554 |
| 2005/0231958 | A1 | 10/2005 | Cutler et al. |
| 2008/0111983 | A1 | 5/2008 | Singer et al. |

FOREIGN PATENT DOCUMENTS

WO  2008/101664 A1  8/2008

* cited by examiner

*Primary Examiner* — Steven H Whitesell Gordon
(74) *Attorney, Agent, or Firm* — Timothy M. Schaeberle

(57) ABSTRACT

A method for providing an actinic illumination energizes solid-state light sources in an array, wherein each solid-state light source emits actinic light of a predetermined wavelength, directs the emitted actinic light from the solid state light sources through one or more compound parabolic concentrators, and forms a field conjugate to an objective lens by directing the concentrated actinic light from each compound parabolic concentrator through one or more lens elements in a lens array. Emission of one or more of the solid state light sources is adjusted to obtain a predetermined illumination pupil envelope function.

17 Claims, 14 Drawing Sheets

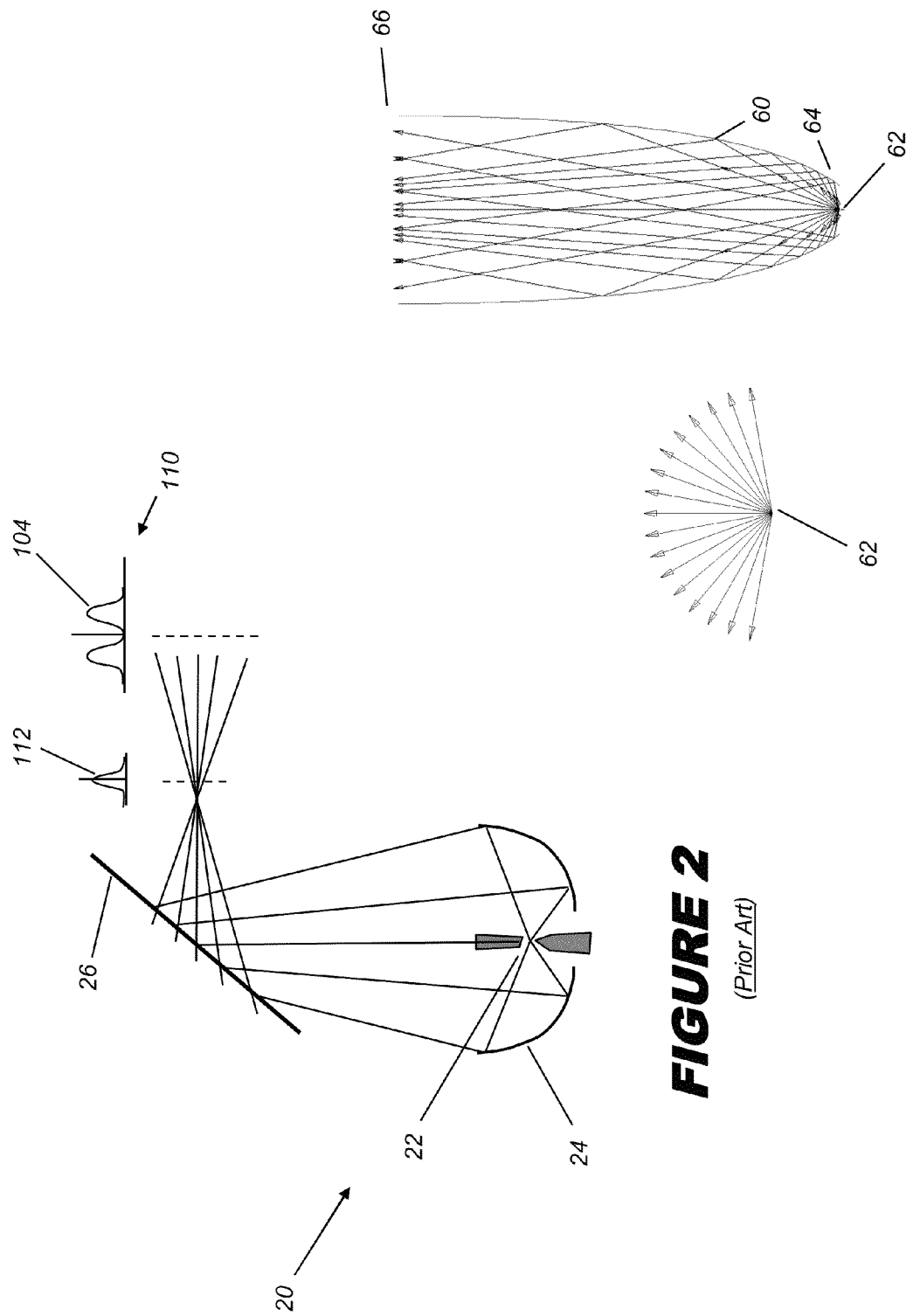

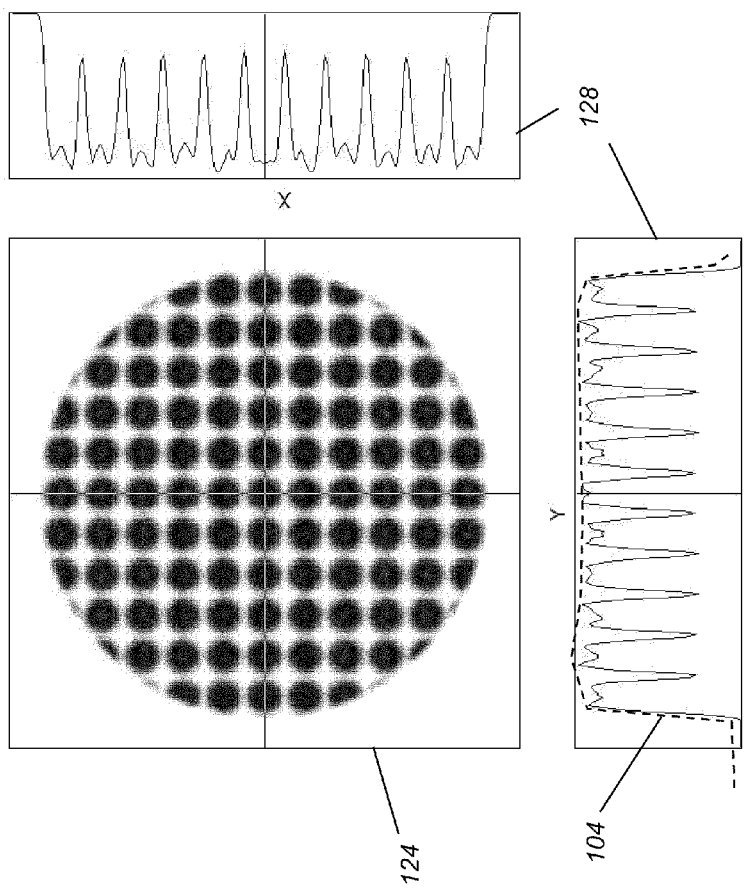
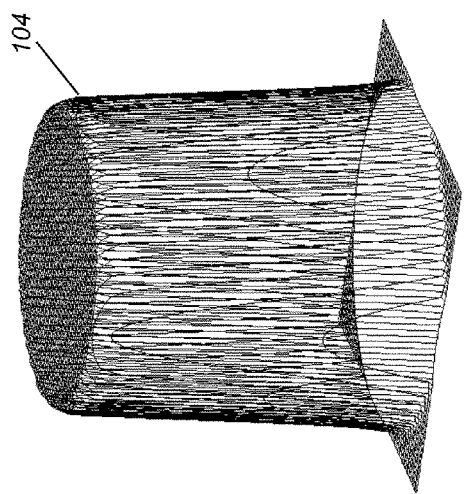
*FIGURE 5B*
*FIGURE 5C*

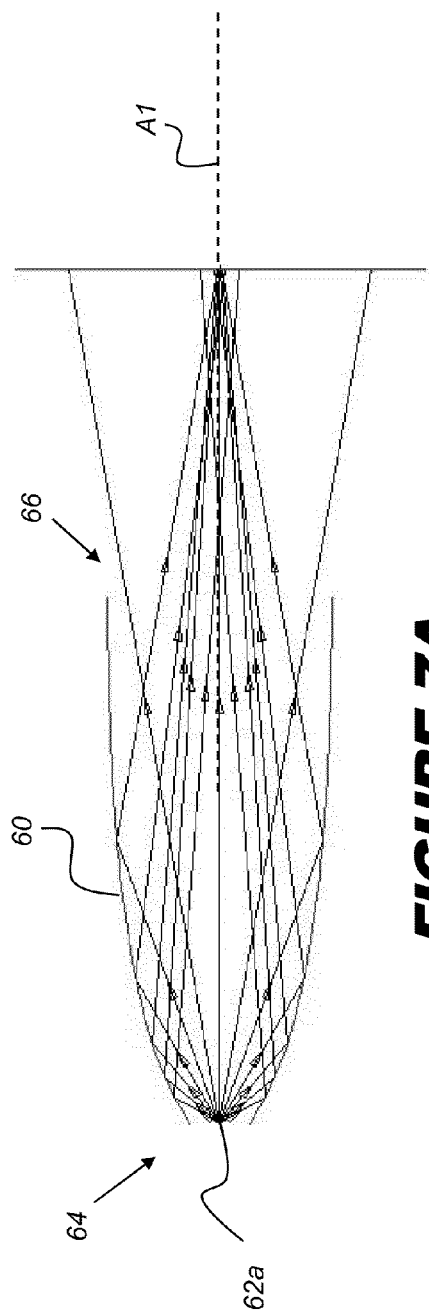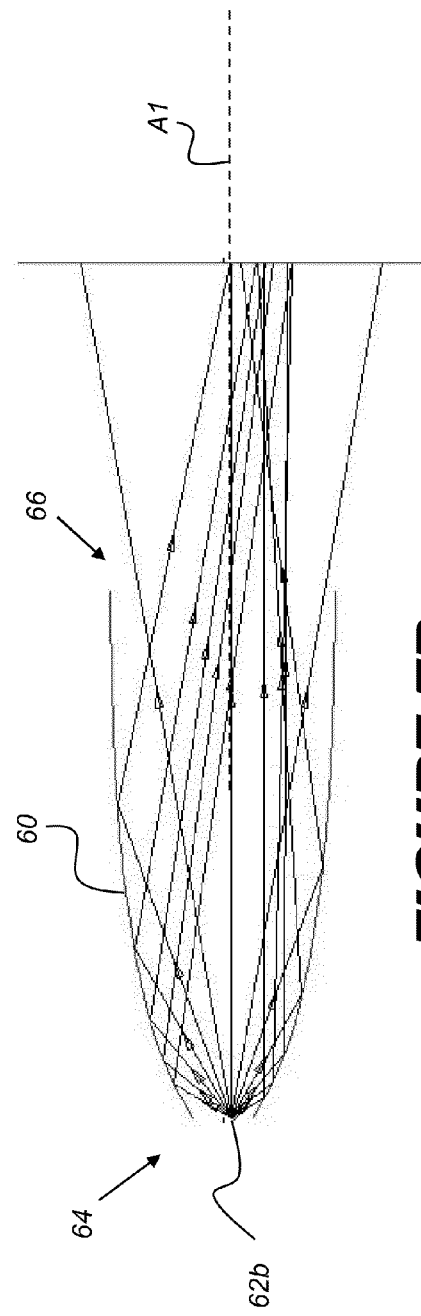

SOLID-STATE ARRAY FOR LITHOGRAPHY ILLUMINATION

CROSS REFERENCE TO RELATED APPLICATIONS

This application claims the benefit of U.S. Provisional Application Ser. No. 61/156,038 filed 27 Feb. 2009, entitled "Solid-State Array for Lithography Illumination" by Malach et al.

FIELD OF THE INVENTION

This invention generally relates to optical systems for forming microlithographic patterns and more particularly relates to apparatus and methods for providing a programmably adaptable illumination using an array of solid-state light emitters.

BACKGROUND

A number of different applications require precise control of light energy at relatively high levels in order to effect a change, such as initiating a chemical reaction or state change. In micro lithography apparatus and systems, widely used in the fabrication of microcircuits of various types, an intense beam of actinic light, suitably shaped and conditioned by a complex and costly optical system, is projected through a projection lens and transmitted through a patterned mask and onto a planar wafer of semiconductor material. This material has been preconditioned with a photoresist material to respond to the actinic light and thereby form a corresponding pattern that provides a portion of the circuitry. The needed light energy levels are typically provided by an ultraviolet (UV) light source, emitting actinic light at below 400 nm.

Conventional microlithography systems have relied on arc lamps and related types of gas discharge lamps as their UV sources. Due to their favorable brightness levels and overall efficiency, arc lamps have been successfully utilized for microcircuit fabrication, offering good resolution above about 1 micron or more. However, arc lamps have a number of unfavorable characteristics, including the following:

(i) Requirement for filtering out the non-actinic wavelengths that are emitted. The arc lamp emits a range of wavelengths in addition to the (actinic) UV light that is used for lithography, such as I-line UV light at 365 nm. The need to filter out the unused light has the unavoidable effect of attenuating some portion of the UV light at the same time.

(ii) High power requirements. Because the useful light for microlithography is only a small percentage of the optical power emitted, these lamps have significant power consumption. The required electrical power can exceed the useful optical power by as much as two orders of magnitude.

(iii) Catastrophic failure modes. Due to the high pressures internal to the lamp structure, failure of the arc lamp generally results in an explosion, with the potential to damage neighboring optical components. Lost time and cost result from the needed cleanup and repair.

(iv) Hazardous substances. Arc-lamps used for UV radiation typically contain hazardous substances, such as mercury. These substances burden the end-user for handling, storage, and disposal of light sources.

(v) Limited component lifetime. Arc lamps have a relatively short useful life, requiring replacement every 700 to 1000 hours.

Added to these disadvantages is the characteristically non-uniform illumination profile for arc lamp emission. To a first approximation, the arc lamp gap is considered to provide a point source, radiating light equally in all directions. A curved reflector gathers and redirects this light for use by the lithography optical system.

For film projectors and other conventional devices, considering the arc lamp as essentially a point source may be sufficient. However, this characterization of the arc lamp is inaccurate for microlithography, which demands extremely high resolution and uniformity. For demanding applications of this type, the illumination energy emitted from the arc lamp and curved reflector, considered in the spatial and angular domains, falls short of what would be provided by a perfect point source. This is noted, for example, in U.S. Patent Application Publication No. 2005/0231958 entitled "Illumination System with Improved Optical Efficiency" by Cutler et al. In particular, the Cutler et al. disclosure describes the "donut hole" intensity profile that inadvertently results from blocking some of the light reimaged onto the source itself from the parabolic reflector. To compensate for this "intrinsic" property of re-imaged arc lamp emissions, Cutler et al. propose a number of improvements to conventional geometries for reflector shape and positioning with arc lamps.

Conventional systems solutions compensate for non-uniformity and other inherent drawbacks of the arc lamp further along the optical path. For example, U.S. Pat. No. 5,675,401 entitled "Illuminating Arrangement Including a Zoom Objective Incorporating Two Axions" to Wangler et al. notes the problem of the dark spot in an arc lamp and compensates using two axions in the optical path to collapse the beam. Other solutions adjust various other optical path components in order to provide a more uniform beam intensity distribution or, alternately, to adapt the inherent beam intensity distribution to achieve uniformity or some particular desired arrangement, such as using a neutral density (ND) filter or wedge in the path of illumination. In a number of cases, other optical components are used to adapt the uniformity of illuminance. For example, one type of approach employs arrays of lenses to alter the light distribution of an optical system by superposition of source illumination. In another approach, an apodizing aperture is provided in cooperation with a cylindrical lens for forming a uniform line of illumination using an arc lamp source.

Another approach used for controlling the intensity profile employs a spatial light modulator, such as a micromirror array, in the path of the source illumination. This strategy is described, for example, in U.S. Pat. No. 7,133,118 entitled "Lithographic Apparatus and Device Manufacturing Method" to Gui et al. This provides some capability for shaping the distribution profile of light provided, but at the cost of considerable added complexity and additional components. Other approaches attempt to adapt the cross-sectional shape of the beam to achieve an appropriate "illumination geometry", as described in U.S. Pat. No. 6,233,039 entitled "Optical Illumination System and Associated Exposure Apparatus" to Yen et al.

In general, it is costly and time-consuming to adapt and adjust the design of system optics in order to compensate for inherent non-uniformity of the light source. This becomes increasingly difficult for higher power microlithography systems, particularly where precision requirements become more stringent. Further, the optics themselves can be fairly complex and require laborious procedures for adjustment and alignment to compensate for imperfections in lens shape and mount precision. These inherent difficulties can also work against achieving a desired illumination profile, since it is sometimes necessary to compromise between making different types of adjustment in order to achieve suitable optical performance.

In microlithography, as in other high-power light applications, conventional solutions add the burden of adjustment for compensating problems with light source uniformity to the already difficult task of adjustment and alignment of the complex optical system overall. It would be advantageous to provide an illumination system that not only reduces the need for adjustment of downstream optics to compensate for uniformity and telecentricity problems, but can even provide a mechanism for adapting the illumination profile to compensate for imperfections in system optics or to enhance other process variables in microlithography fabrication applications.

SUMMARY

It is an object of the present invention to advance the art of illumination for microlithography. With this object in mind, the present invention provides a method for providing an actinic illumination comprising:

a) energizing a plurality of solid-state light sources in an array, wherein each solid-state light source emits actinic light of a predetermined wavelength and directing the emitted actinic light from the plurality of solid state light sources through one or more compound parabolic concentrators;

b) forming a field conjugate plane for an objective lens by directing the actinic light from each of the one or more compound parabolic concentrators through one or more lens elements in a lens array; and c) adjusting the emission of one or more of the solid state light sources to obtain a predetermined illumination pupil envelope function.

It is a feature of the present invention that it employs compound parabolic collectors for redirecting and conditioning the energy profile of actinic light toward an image plane for microlithography.

It is an advantage of the present invention that it provides programmable control of the output energy profile of illumination apparatus for lithography projection. This obviates the need for more labor-intensive and expensive adjustments to the optical system and allows dynamic adjustments to be readily made using computer commands.

These and other aspects, objects, features and advantages of the present invention will be more clearly understood and appreciated from a review of the following detailed description of the preferred embodiments and appended claims, and by reference to the accompanying drawings.

BRIEF DESCRIPTION OF THE DRAWINGS

While the specification concludes with claims particularly pointing out and distinctly claiming the subject matter of the present invention, it is believed that the invention will be better understood from the following description when taken in conjunction with the accompanying drawings.

FIG. 2 shows the pupil envelope function as a far field illumination profile.

FIG. 3A shows light emission from an LED and shows how light is redirected within a compound parabolic collector (CPC).

FIG. 5B is a sequence of plots that show how the pupil envelope function for the illumination source of FIG. 5A is obtained.

FIG. 5C is a three-dimensional plot showing a flat-top pupil envelope function for a solid-state light array.

FIGS. 7A, 7B, and 7C are cross-sectional views of a CPC collector showing representative rays emitted wherein only a portion of the solid state light sources are energized.

DETAILED DESCRIPTION

Figure 1A:
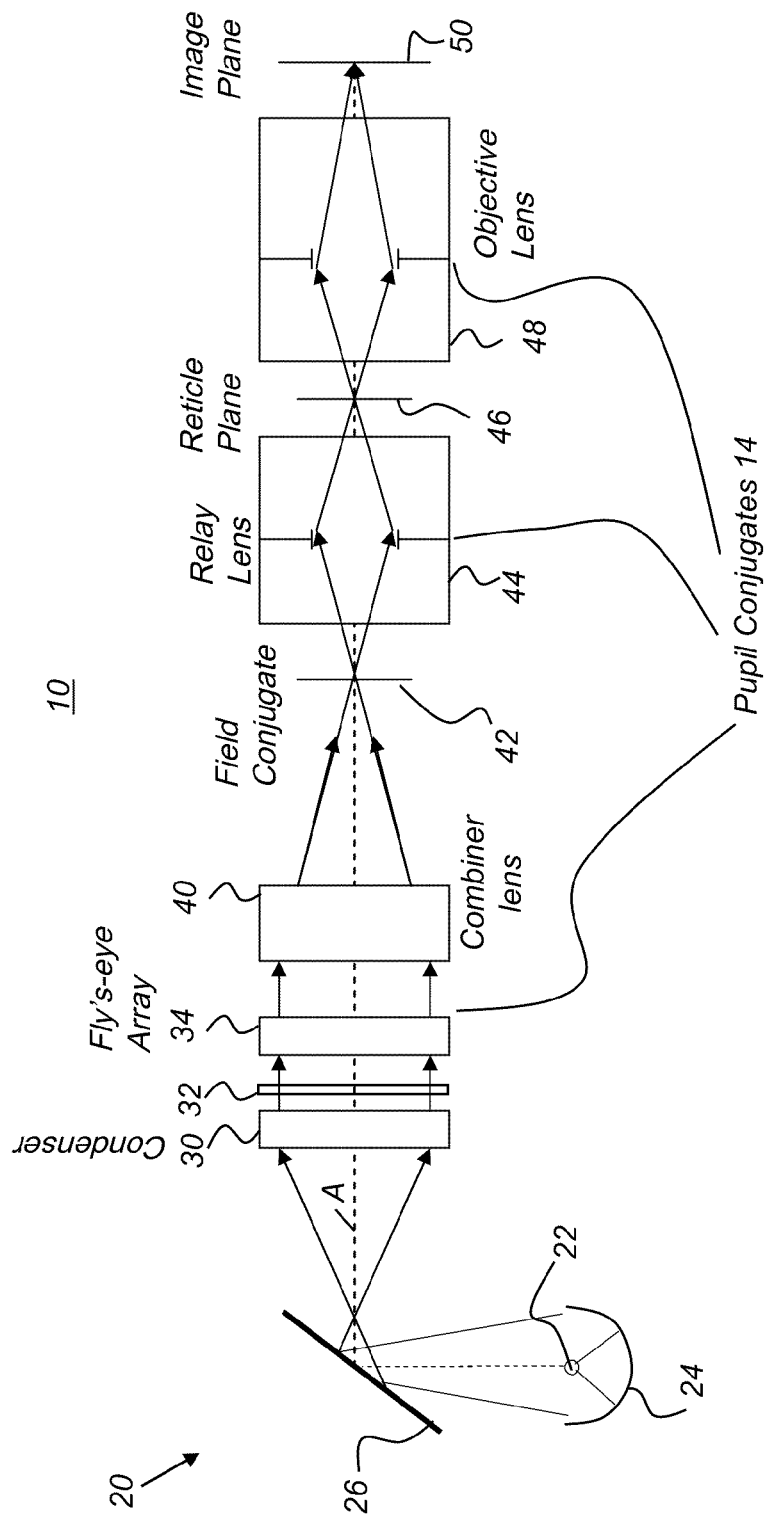
FIG. 1A is a schematic block diagram of a microlithography apparatus that uses an arc lamp.

It is to be understood that elements not specifically shown or described may take various forms well known to those skilled in the art. For example, conventional microlithographic optical systems are well known in the optical arts and are not, therefore, described in detail herein, except for those parts of systems related either directly to embodiments of the present invention or cooperating in some way with embodiments of the present invention.

Figures shown and described herein are provided in order to illustrate key principles of operation and component relationships along their respective optical paths according to the present invention and are not drawn with intent to show actual size or scale. Some exaggeration may be necessary in order to emphasize basic structural relationships or principles of operation. Some conventional components that would be needed for implementation of the described embodiments, such as various types of optical mounts, for example, are not shown in the drawings in order to simplify description of the invention itself. In the drawings and text that follow, like components are designated with like reference numerals, and similar descriptions concerning components and arrangement or interaction of components already described are omitted. Where they are used, the terms "first", "second", and so on, do not denote any ordinal or priority relation, but are simply used to more clearly distinguish one element from another.

In the context of the present disclosure, the terms "actinic radiation" or "actinic light" refer to radiation that effects a chemical or state response in a surface, material, or coating. In many applications, for example, a chemical response is needed for forming an image or pattern, such as the pattern formed on the photosensitized substrate in a microlithographic imaging system. In micro lithography and other applications, UV light, generally below about 440 nm, is the actinic radiation that is conventionally used. Actinic radiation is also used in curing inks or other substances and in other applications that require polymerization of an irradiated material.

In the context of the present invention, the term "pupil envelope function" denotes a spatial and angular profile of actinic light energy, considered at the pupil or stop of the lithographic objective lens, or at a plane optically conjugate to this pupil.

For a better understanding of aspects of the present invention in various embodiments, it is useful to first review the basic architecture of a microlithography projection apparatus as used with its conventional arc lamp illumination components and to consider the fixed spatial and angular output energy profile of the arc lamp. Referring to FIG. 1A, there is shown, in block diagram form, an arrangement of the illumination and optical system components of a conventional microlithography projector 10. In an illumination apparatus 20, a lamp 22 and reflector 24, such as an arc lamp and a parabolic, elliptical, or other curved reflector, cooperate with an optional turning mirror 26, a cold mirror that helps to dissipate IR, to direct illumination along an optical axis A to a condenser lens 30 that provides a measure of collimation for the illumination. One or more filters 32 are additionally needed for removing unwanted spectral content. The actinic illumination wavelengths are then directed through a uniformizer such as a fly's-eye array 34 or other type of light integrator that provides homogenization for appropriately mixing light and improving light uniformity. A combiner lens 40 then provides uniform light distribution of this light source at a plane conjugate to the image or field of the system (at the location indicated as a field conjugate 42 in FIG. 1). An optional relay lens 44 directs this light through the patterned mask at a reticle plane 46. (In the absence of a relay lens, the combiner lens illuminates the reticle plane directly). The patterned illumination is then directed through an objective lens 48 to an image plane 50 on the surface of the photosensitized substrate. Pupil conjugates 14 are at fly's eye array 34, and at the respective pupils of optional relay lens 44 and objective lens 46 as indicated.

Figure 1C:
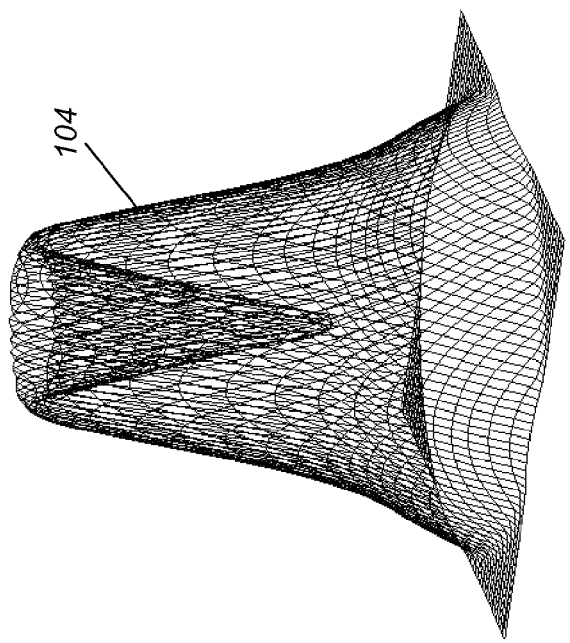
FIG. 1C is a three-dimensional plot showing the pupil envelope function for a typical system in which the illumination pupil is conjugate to the arc lamp's far field.
Figure 1B:
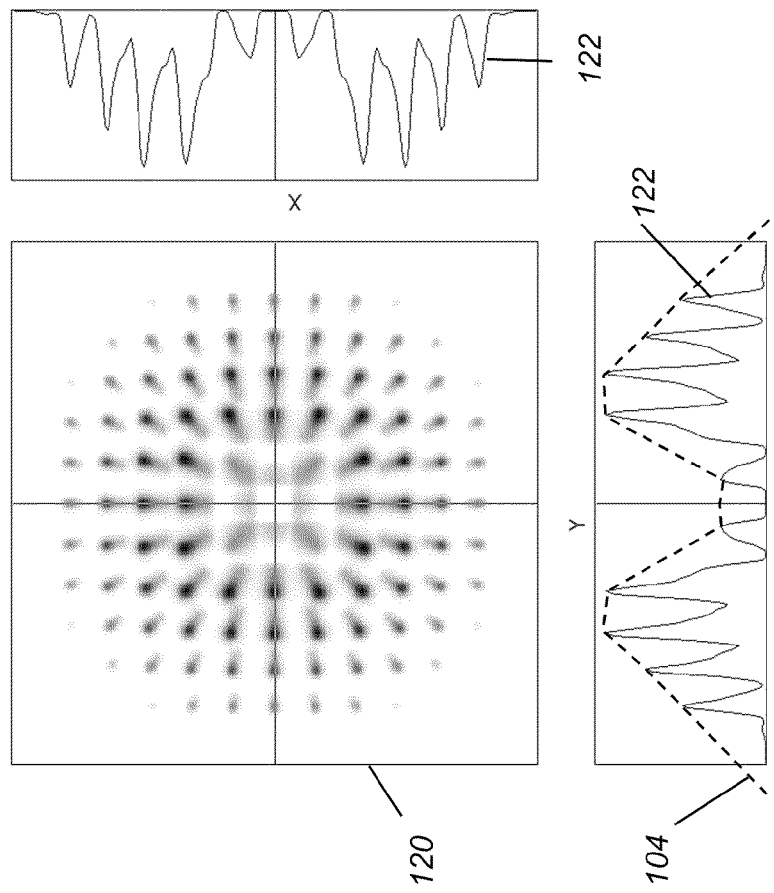
FIG. 1B is a sequence of plots that show how the pupil envelope function for the illumination source of FIG. 1A is obtained.

As was noted earlier in the Background section, the spatial and angular illumination or spatial and angular energy profiles of the arc lamp have fixed characteristic shapes and properties that can require compensation from other components in the optical system. In the context of the present disclosure, the spatial and angular energy profiles of a light source can be described in terms their impact on the illumination system's pupil envelope function. FIGS. 1B and 1C show how the pupil envelope function is obtained and how it can be represented in graphical form.

FIG. 1B shows a front plane distribution of light from an arc lamp at the output of uniformizer array 34 in a graph 120, from a system with an optical architecture as shown in FIG. 1A. Orthogonal profiles 122 of graph 120 show how a pupil envelope function 104, shown by a dashed line, can be represented in two-dimensional graph form. Pupil envelope function 104 shows the energy profile of this illumination beam as it leaves the fly's eye array 34 or other uniformizer and is propagated through system optics. The pupil envelope is considered at the far field of the arc lamp as imaged by curved reflector 24.

The three-dimensional view of FIG. 1C then shows the energy profile of pupil envelope function 104 for an arc lamp source. Referring to FIG. 2, another way to consider pupil envelope function 104 from arc lamp 22 is shown. Again, in this representation, illumination apparatus 20 has a characteristically non-uniform far field illumination profile 110 at uniformizer array 34. It must be observed that this energy profile is fixed for the arc lamp source, with the characteristic pupil envelope function 104 that is shown in FIGS. 1B and 1C.

Unlike the arc lamp illumination of earlier devices, apparatus and methods of embodiments of the present invention enable both the spatial and angular energy profile of the pupil envelope function to be varied, rather than fixed. To provide this capability, embodiments of the present invention use an arrangement of programmably controllable solid-state light emitters, such as light-emitting diodes (LEDs), that allow a measure of control of the light energy profile that is generated. The solid-state light sources are provided with a collector array having a light collection and redirection geometry that allows an increased measure of control of the light energy that is provided, both with respect to light intensity and to angular composition.

Figure 3B:
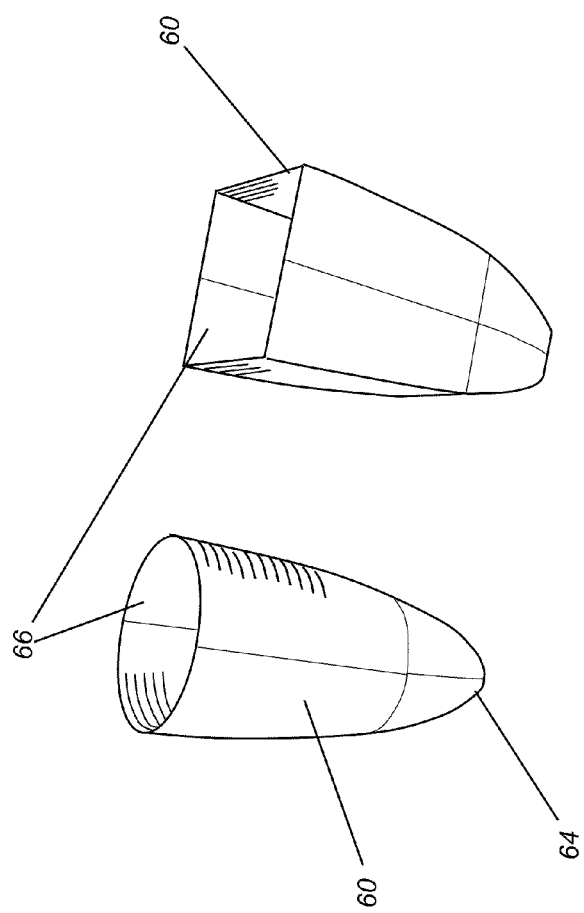
FIG. 3B shows various shapes and types of compound parabolic concentrators for use with solid-state light sources.

In order to better understand how this performance improvement is provided, it is first useful to consider the nature of LED emission and how this emitted light can be redirected. As shown in FIG. 3A, LED emission is over a wide angle, approximately $2\pi$ steradians (180 degrees in the cross-section shown). Embodiments of the present invention take advantage of particular strengths of the Compound Parabolic Concentrator (CPC) for redirecting light emitted from an LED. Referring to FIG. 3A, there is shown, in cross-sectional view, rays of light redirected from an LED that is disposed at a base portion 64 of a CPC collector 60 having an inner reflective surface. Light is emitted from an output portion 66. FIG. 3B shows CPC collector 60 in two different embodiments, as circular in orthogonal cross-section relative to a central axis or, optionally, as rectangular in cross-section.

Figure 4:
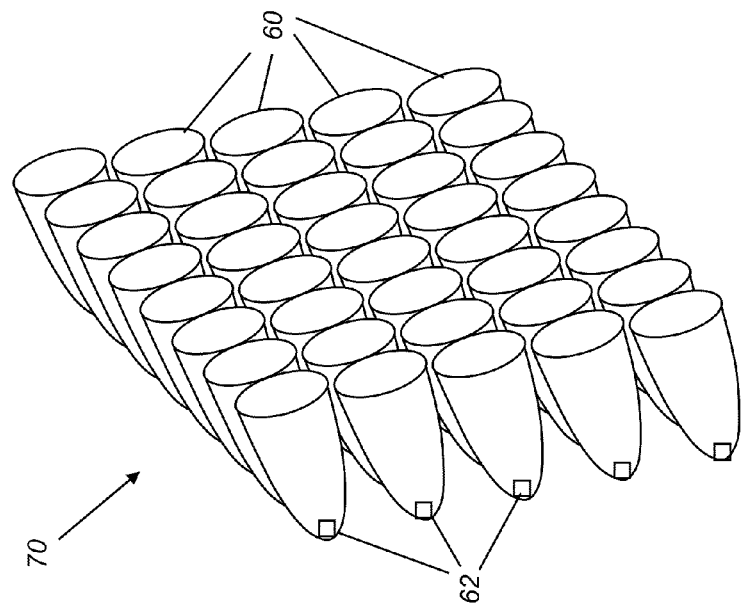
FIG. 4 is a perspective view showing an array of concentrators with their solid-state light sources.

A particular advantage of the CPC shape is that it can be used singly or arranged by multiples in an array. The perspective view of FIG. 4 shows a portion of a solid-state emitter array 70 that has numerous CPC collectors 60 as actinic light collectors and re-directors. Near the base of each CPC collector 60 are one or more LEDs 62 or other solid-state light sources for emitting illumination for use in a microlithography apparatus. Each LED or pair of LEDs or other subset grouping of LEDs can be energized separately under control logic, as described subsequently. Embodiments of the present invention may use a collector array that has as few as one CPC collector or an array with multiple CPC collectors 60. CPC collectors 60 in the array may have regular spacing or may have randomized spacing.

Figure 5A:
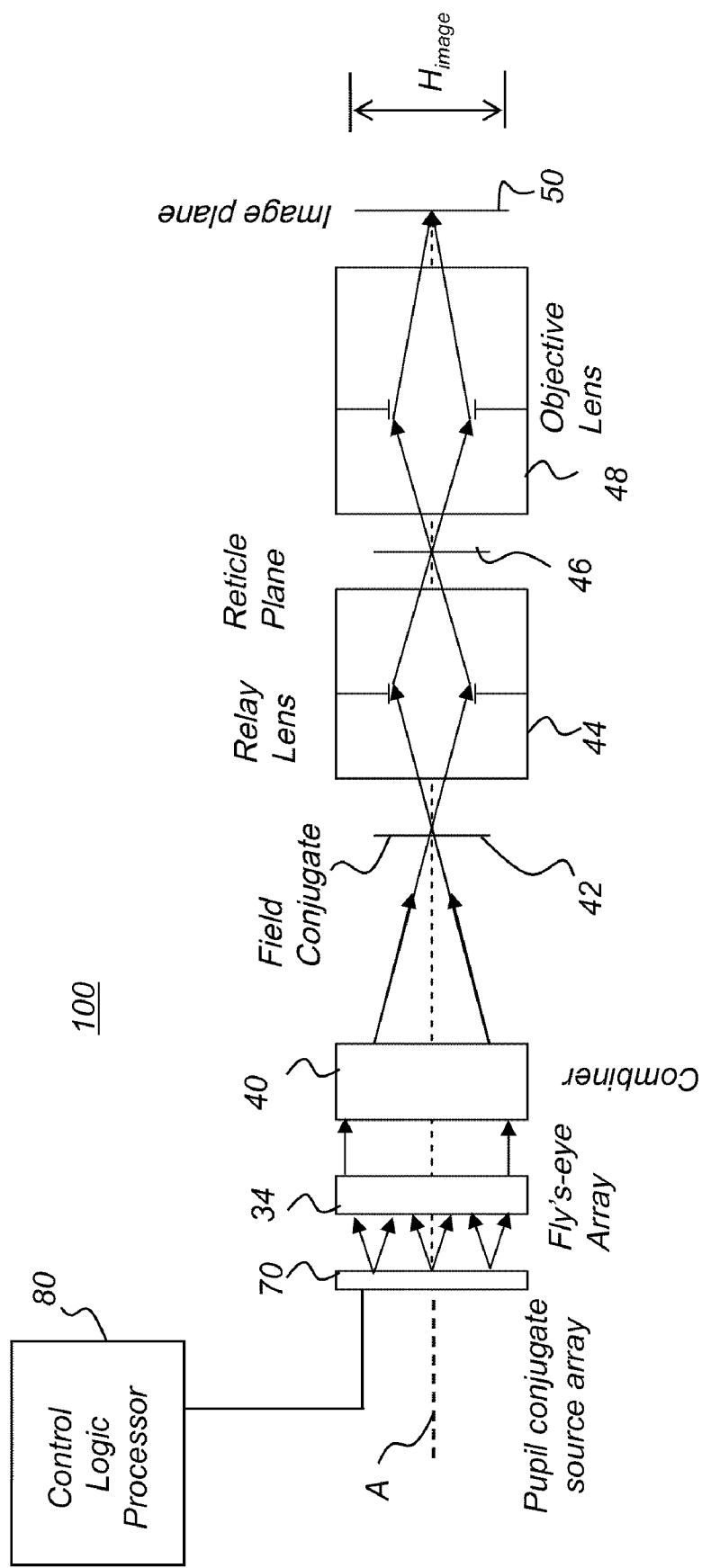
FIG. 5A is a schematic block diagram of a microlithography apparatus that uses the collector array of the present invention as a pupil source.

The schematic block diagram of FIG. 5A shows an embodiment of a microlithography projector 100 using collector array 70 as shown in FIG. 4. In the FIG. 5A configuration, collector array 70 is arranged so that the array's spatial irradiance envelope function is at a pupil conjugate, situating the illumination components at positions along the optical path similar to their positions for arc lamp illumination, described earlier with reference to FIG. 1A. Noticeably, the basic components from fly's eye lens array 34 forward along the optical axis A are the same with both configurations and are similar to those previously described for the conventional microlithography projector 10 of FIG. 1A. A control logic processor 80 provides programmable logic control over solid-state emitters in array 70, as described in more detail subsequently.

FIG. 5B shows a front plane distribution of light from an array of CPC's and light sources at the output of uniformizer array 34 in a graph 124. Orthogonal profiles 128 of graph 124 show pupil envelope function 104, shown by a dashed line. Pupil envelope function 104 shows the energy profile of this illumination beam as it leaves the fly's eye array 34 and is propagated through system optics.

The three-dimensional view of FIG. 5C then shows the energy profile of pupil envelope function 104 for equal light output from each CPC collector 60. This "flat-top" profile is unlike the fixed "donut shaped" profile that applies for the arc lamp and that was shown by way of example in FIG. 1C. More importantly, array 70 is capable of providing a measure of control over the shape of envelope function 104, so that the energy distribution of the actinic illumination can be modified to suit the requirements of a particular system or application.

Referring to the intensity distribution diagrams of FIGS. 6A-6G, there are shown a number of different spatial profiles that represent a pupil envelope function 104 with LED emitters at different power levels. The vertical axis represents light intensity; the horizontal axis represents spatial position across a particular cross-section of collectors 60. With reference to FIG. 4, the height of each individual rectangle in FIGS. 6A-6G can be considered to represent the relative light output from one CPC collector 60, considered along a cross section of array 70. A dashed line traces the approximate boundaries of pupil envelope function 104 for each example in FIGS. 6A-6G.

Figure 6C:
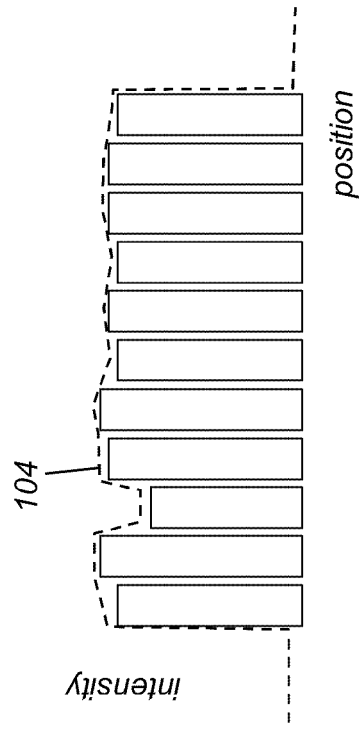
FIGS. 6A, 6B, 6C, 6D, 6E, 6F, and 6G show, in cross section, a number of exemplary pupil envelope functions that can be formed using the solid-state light array of FIG. 4.
Figure 6D:
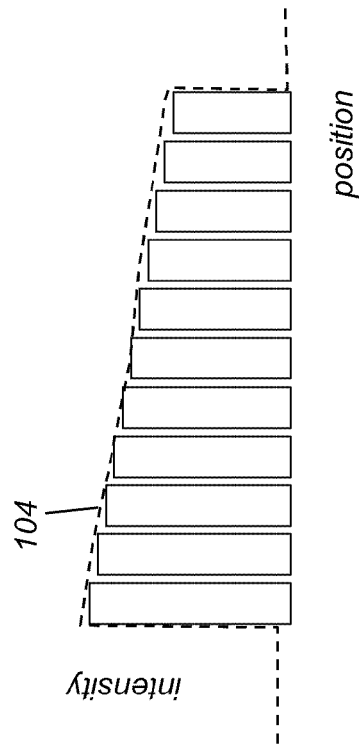
Figure 6A:
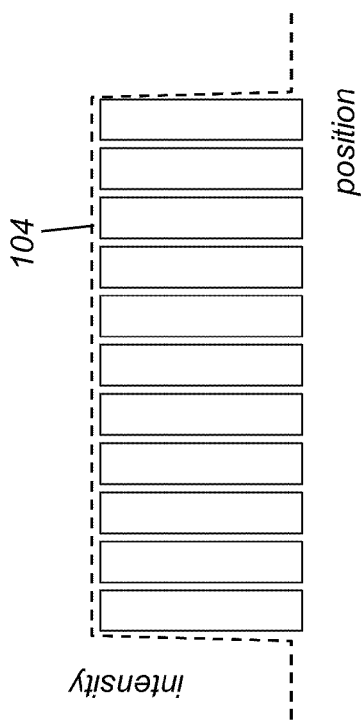
Figure 6B:
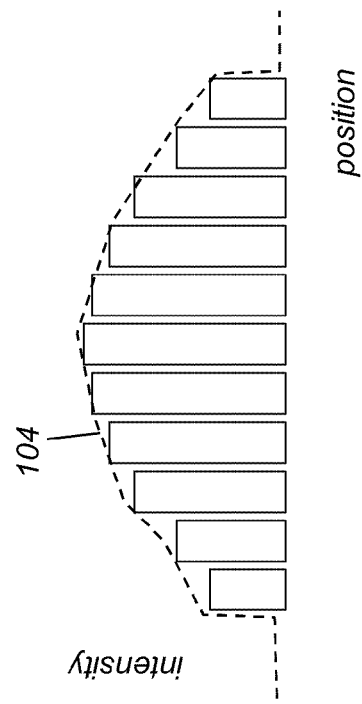
Figure 6E:
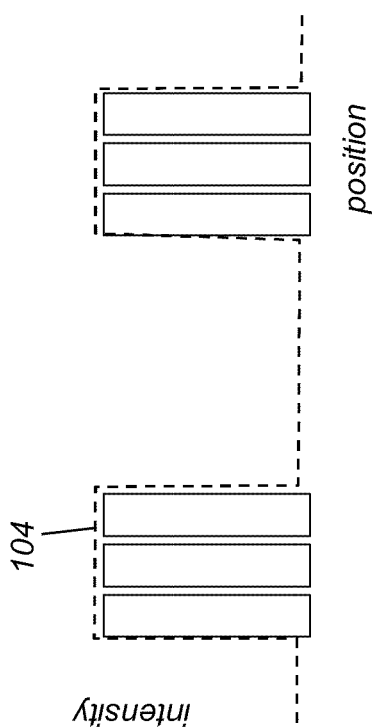
Figure 6F:
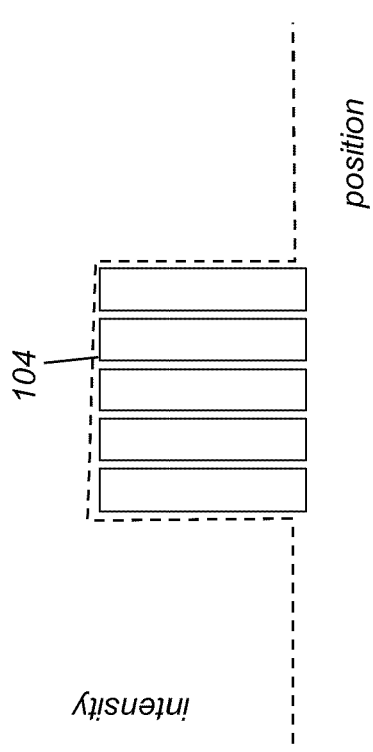
Figure 6G:
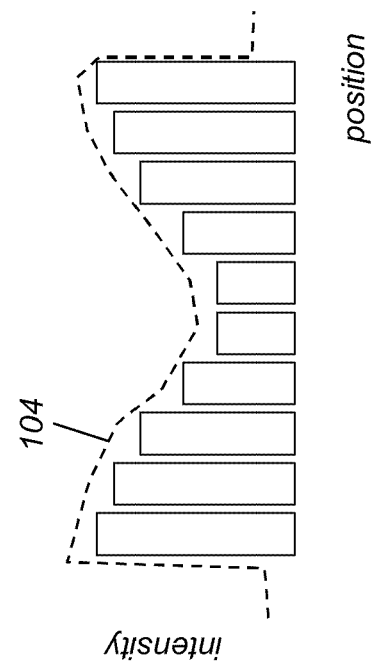

In FIG. 6A, each CPC collector outputs a substantially equal amount of light, yielding the "flat top" pupil envelope function 104 that was shown in FIGS. 5B and 5C. FIG. 6B shows how a Gaussian pupil envelope function 104 is provided. FIG. 6C shows a fully customized distribution for pupil envelope function 104. FIG. 6D shows a skewed pupil distribution. FIG. 6E shows a distribution with reduced illumination NA where the peripheral CPC collectors 60 are turned off. FIG. 6F shows a highly annular pupil distribution, with CPC collectors 60 nearest the center of array 70 turned off. FIG. 6G shows the use of array 70 to shape pupil envelope function 104 for emulating arc lamp illumination.

It can be appreciated that the simplified diagrams of FIGS. 6A through 6G represent just a portion of the possible arrangements for providing a pupil envelope function 104 of a given shape. As can be appreciated from FIGS. 6A-6G, the apparatus of the present invention for obtaining pupil envelope function 104 can be used not only to modify the cross-sectional beam shape of the actinic light, but also to change its spatial irradiance in order to provide a variable spatial profile. Unlike the conventional arc lamp described with reference to FIGS. 1B, 1C, and 2, array 70 can be controlled to provide a wide range of different spatial profiles.

Figure 7C:
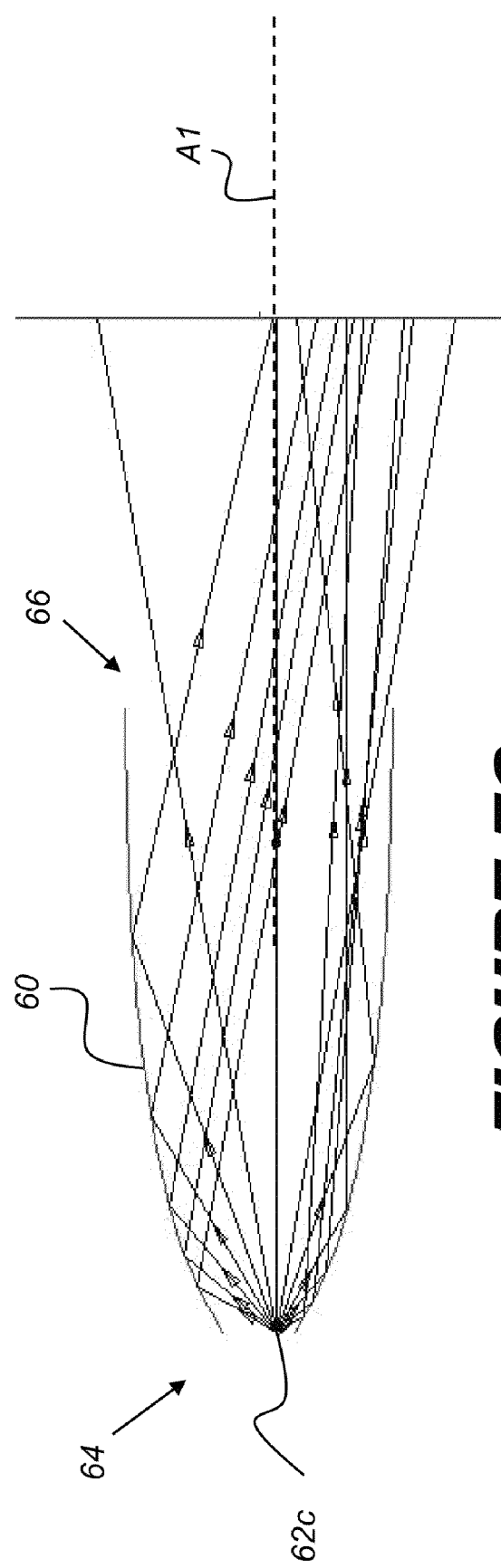

In addition to controlling the cross-sectional beam shape and spatial irradiance of the actinic light output from the CPC array, another advantage of this invention relates to the capability for modifying the angular content of the emitted light. FIGS. 7A, 7B, and 7C are cross-sectional views of CPC collector 60 showing representative rays emitted wherein only a portion of the solid state light sources at base portion 64 of CPC collector 60 are energized. In FIG. 7A, emitting LED 62a is approximately centered within base portion 64, so that emitted rays are generally clustered equally about a central optical axis A1. FIG. 7B shows how this angular behavior changes when emitting LED 62b, slightly shifted downward with respect to the position of LED 62a in FIG. 7A, emits light through CPC collector 60. In this case, the angle of the light output at output portion 66 shifts relative to axis A1. In FIG. 7C, there is further angular shift of emitted rays from LED 62c, which is correspondingly positioned further away from optical axis A1. It must be emphasized that the simulation that is used for the examples of FIGS. 7A-7C assumes energization of a single point source. There could alternately be two or more LED sources ON simultaneously for directing light through CPC collector 60.

Figure 7D:
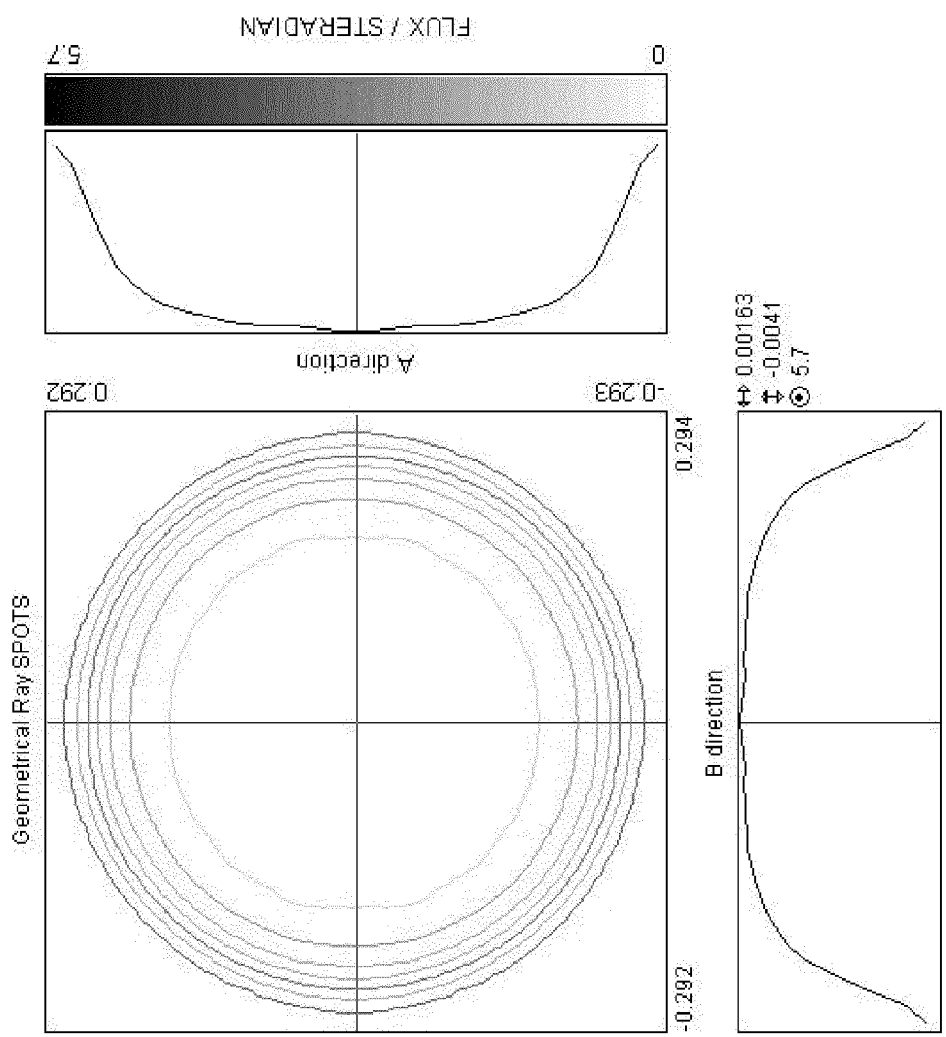
FIGS. 7D and 7E are contour graphs showing lines of equal irradiance plotted on an angular scale.
Figure 7E:
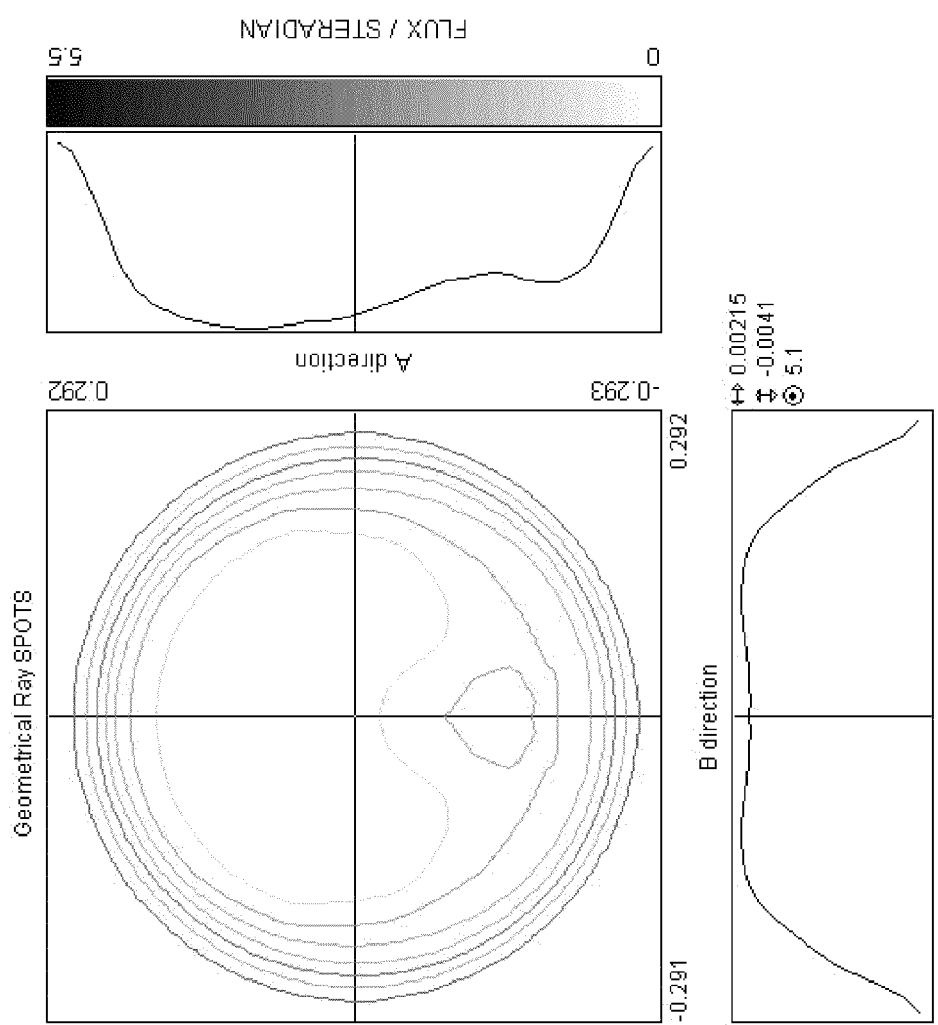

FIGS. 7D and 7E are contour graphs showing lines of equal irradiance plotted on an angular scale for examples of different angular emission arrangements at a particular CPC collector 60. Orthogonal cross-sections in FIGS. 7D and 7E show how the angular output is modified for each of the angular plots. FIG. 7D relates most closely to the example of FIG. 7A, with centered LED 62a. As can be seen from the contour graph and cross-sectional angular data of FIG. 7D, the centered arrangement of FIG. 7A is generally best suited where a more uniform profile is desired. FIG. 7E shows light energy profile information for off-center LED positioning, such as that described earlier with respect to FIGS. 7B and 7C.

Figure 8:
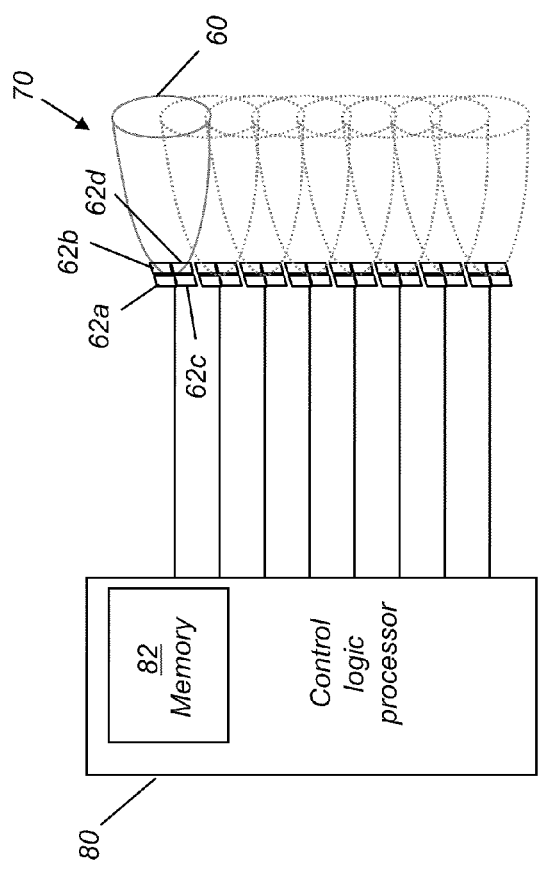
FIG. 8 is a schematic block diagram showing control circuitry for a portion of an array of solid-state light emitters.

Collector array 70 is particularly advantaged in embodiments that allow individual control of LEDs. Referring to FIG. 8, optional control logic processor 80 provides programmable control of one or more individual solid-state emitters, shown as LEDs 62a, 62b, 62c, and 62d in collector array 70. That is, one or more of LEDs 62a-62d in collector array 70 is under the control of logic circuitry that selectively energizes or de-energizes the one or more LEDs 62a-62d to generate a specified pupil envelope function according to electronically encoded data and instructions stored in a memory 82 or according to entered instructions. The level of control that is exercised can be as complex as is needed, from being able to individually manipulate the energizing of each LED 62a-62d individually, to selective energization of pairs or other groupings of LEDs 62a-62d, to control of as few as one LED 62 in the array. Memory 82 also stores one or more predetermined pupil energy profiles in one embodiment. Control logic processor 80 may be a microprocessor or other dedicated processor circuit that executes a programmed instruction for selectively energizing each of LEDs 62a-62d in the array. In one embodiment, the instruction is hard-wired; the function of control logic processor 80 is simply provided by a mode switch selection.

Figure 9:
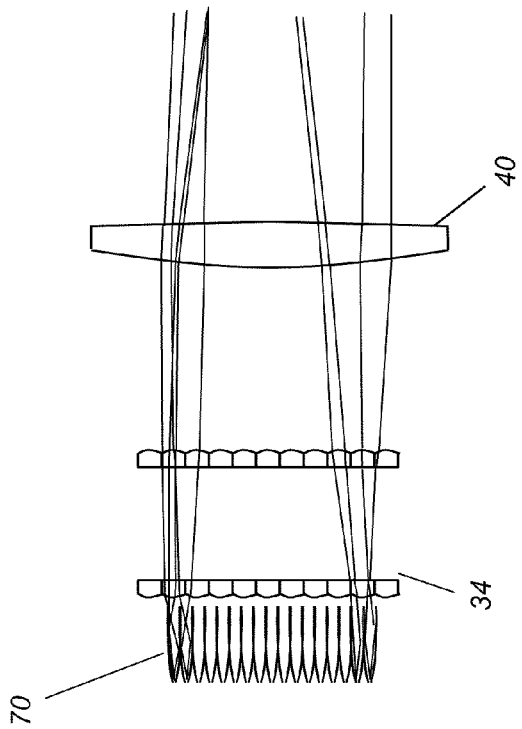
FIG. 9 is a schematic block diagram of a portion of the illumination light path in more detail for a system employing a pupil-conjugate source envelope.

The function of fly's-eye array 34 is to mix and direct light from CPC collectors 60 in order to provide improved uniformity to the illumination. FIG. 9 shows this portion of the illumination apparatus enlarged, with portions of CPC collector array 70, fly's eye array 34 and part of combiner optics. In order to reduce the likelihood of unwanted patterning, light from each collector array 70 is generally directed through multiple lenslets in fly's eye array 34 in a non-repeating or random pattern. Otherwise, if regular spacing and 1:1 correspondence or other integral spacing were used, undesirable moire patterns could result.

Figure 10:
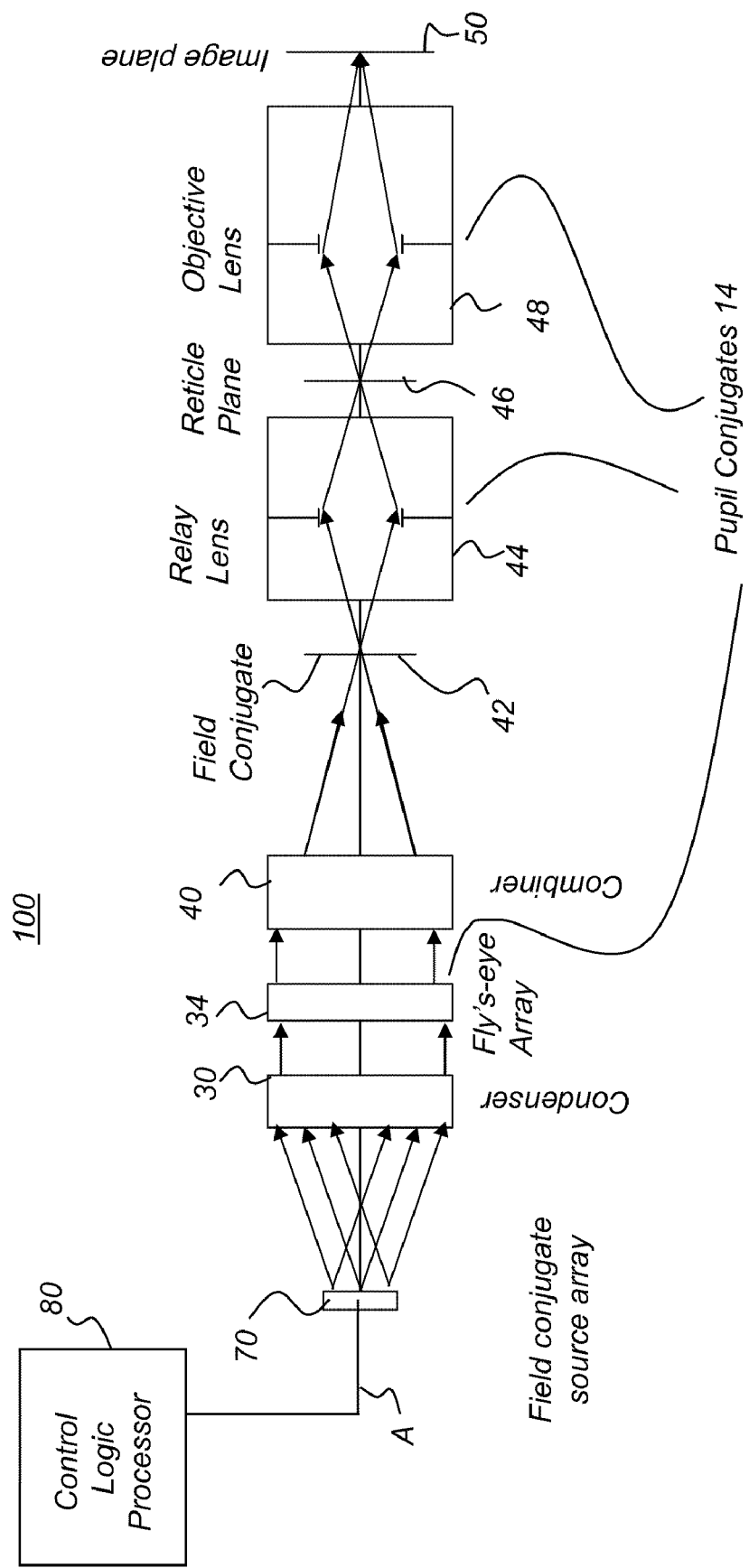
FIG. 10 is a schematic block diagram of a microlithography apparatus for which the angular or far-field emittance profile of the collector array of the present invention is conjugate to a field.

In the FIG. 5A configuration of micro lithography projector 100, the source illumination array 70 is configured such that its spatial irradiance profile maps to a pupil conjugate, similar to the use of the arc lamp light source described with reference to FIG. 1A. In the alternate embodiment of microlithography projector 100 in FIG. 10, collector array 70 is configured as a field conjugate. In the field conjugate arrangement, condenser element, shown here as condenser lens 30, is added, disposed between collector array 70 and fly's-eye lens array 34. Noticeably, many of the basic components from the fly's eye lens array 34 forward are the same with both pupil- and field-conjugate configurations and are similar to those previously described for the conventional microlithography projector 10 of FIG. 1A. Adjustment of this pupil envelope function can be effected by changing the angle of emitted light, as was described and shown with respect to FIGS. 7A-7E.

CPC Design

As was shown in FIG. 3B, CPC design allows a number of variations in cross section. Depending on the shape of the individual fly's-eye elements (circular or rectangular), the CPCs in array 70 can have either circular or rectangular geometry to match the collection NA of those elements more compatibly.

CPC sizing depends on a number of factors, including the number of LED emitters provided within each CPC collector 60. The CPC exit angle is functionally dependent on both its entrance and exit aperture diameters as follows:

$$\theta = \sin^{-1}\left(\frac{d_{input}}{d_{output}}\right)$$

CPCs are generally classified according to their exit aperture angles.

The equation $$\theta = \sin^{-1}\left(\frac{d_{input}}{d_{output}}\right)$$

suggests that there exist of set of CPCs of different sizes that will produce the same exit angles. Factors to consider include the following:

- Maximum length of the CPC desired (important for general manufacturability as well as light loss for dielectric-filled CPCs);
- Number of LED dies to be used within the input aperture of each CPC;
- Granularity of control needed for pupil or field trimming.

In one embodiment, for example, CPC output radius dimensions of approximately 1 cm are used. CPC materials include glass, plastic, and other materials, with suitable reflective coatings.

From another aspect, the use of array 70 allows adjustment of the telecentricity of light at the image plane.

Advantageously, LED and other solid-state emissive sources are close to monochromatic and can be obtained at the needed wavelengths, so that filtering of the emitted light is not needed.

The procedure for controlling the behavior of collector array 70 in order to provide the needed output energy profile of the pupil envelope function is straightforward. As a first step, a measurement is taken without modulating light from array 70, typically at the output of fly's eye array 34, at image plane 50, or at some other useful point. This initial measurement is used to determine the characteristics of the existing energy profile. Following this initial measurement, adjustments and subsequent measurements can be made in subsequent feedback loops, with each iteration achieving results closer to the intended energy distribution.

Unlike arc lamp and other illumination sources for which the output energy profile is relatively fixed, collector array 70 of the present invention, by controlling either or both light intensity and angle according to a pupil envelope function, is able to provide a measure of control and variability of its energy profile. Thus, for example, collector array 70 can provide an energy profile that is optimized for a particular optical system or substrate condition. As has been shown, the control capability of the present invention goes well beyond mere control of the cross-sectional shape of the illumination beam, allowing control of intensity from each light source in the array as well as control of the angular content of the illumination. Collector array 70 can even be used to emulate the energy profile of an arc lamp or other type of light source, as was described earlier with reference to FIG. 6G.

In embodiments of the present invention, the angle and size of the light source is well-matched to the downstream optical architecture. For some systems, the collector array of the present invention can be used as a retrofit, replacing the lamp housing of existing lithography projection apparatus with a solid state illumination source.

Unlike the arc lamp sources that have been previously used for microlithography, the LED sources of embodiments of the present invention have long component lifetimes and do not exhibit catastrophic failure modes that damage nearby equipment. Disposal of the spent LED requires only standard electronic component disposal practices. LEDs are inherently more efficient than arc lamp sources, particularly since filtering is not needed.

The invention has been described in detail with particular reference to certain preferred embodiments thereof, but it will be understood that variations and modifications can be effected within the scope of the invention as described above, and as noted in the appended claims, by a person of ordinary skill in the art without departing from the scope of the invention. For example, while LEDs are used as the solid state light sources in the embodiments described, other types of solid-state emitters could also be used, such as laser arrays.

Thus, what is provided is an apparatus and method for providing lithographic illumination using solid-state light emitters.

The invention claimed is:

1. A method for providing an actinic illumination comprising:
    a) energizing two or more solid-state light sources in an array, wherein each solid-state light source emits actinic light of a predetermined wavelength and directing the emitted actinic light from the two or more solid state light sources through a compound parabolic concentrator;
    b) directing the actinic light from the compound parabolic concentrator through one or more lens elements in a lens array and toward a field conjugate plane of an objective lens; and
    c) adjusting the emission intensity of at least one of the two or more solid state light sources to obtain an actinic illumination beam having a predetermined angular irradiance and directing the actinic illumination beam toward an image plane.

2. The method of claim 1 wherein said predetermined angular irradiance provides a first predetermined pupil envelope function and further comprising the step of adjusting the emission of at least one of the two or more solid state light sources to change the angular irradiance according to a second predetermined pupil envelope function that is stored in an electronic memory.

3. The method of claim 1 wherein adjusting the emission intensity of at least one of the two or more solid state light sources comprises varying one or more of pulse frequency or pulse duration.

4. The method of claim 1 wherein one or more of the solid-state light sources is a light-emitting diode.

5. The method of claim 1 further comprising directing the actinic light through a combiner lens.

6. The method of claim 1 further comprising directing the actinic light through a relay lens.

7. The method of claim 1 wherein the predetermined wavelength is below 440 nm.

8. The method of claim 2 wherein the second pupil envelope function is further obtained by adjustment of at least the spatial irradiance output of the illuminating array.

9. The method of claim 1 further comprising disposing a condenser element between the plurality of light sources and the lens array.

10. An apparatus for microlithographic projection comprising:
   a) an illuminating array comprising one or more compound parabolic light collectors, each light collector having a collector optical axis and having, near its base, two or more solid-state light sources energizable to emit actinic light, wherein at least one of the two or more solid-state light sources is spaced apart from the collector optical axis of the corresponding compound parabolic light collector;
   b) control logic circuitry adapted to selectively energize each of the two or more solid-state light sources to provide a predetermined angular irradiance according to one or more pupil envelope functions stored in a memory;
   c) a lenslet array disposed to direct actinic light emitted from the illuminating array of compound parabolic light collectors along a projection apparatus optical axis;
   d) a combiner lens element disposed to direct actinic light from the lenslet array toward a reticle plane along the projection apparatus optical axis; and
   e) an objective lens disposed to image the reticle plane onto an image plane for forming a microlithographic pattern.

11. The apparatus of claim 10 further comprising a relay lens disposed to provide a field conjugate plane in the path of incident actinic light at the reticle plane.

12. The apparatus of claim 10 further comprising a condenser element disposed to direct light from the illuminating array toward the lenslet array.

13. The apparatus of claim 10 wherein at least one of the solid-state light sources is a light-emitting diode.

14. The apparatus of claim 10 wherein at least one of the solid-state light sources is a laser.

15. The apparatus of claim 10 wherein the illuminating array is disposed at a pupil conjugate of the objective lens.

16. The apparatus of claim 10 wherein the illuminating array is disposed at a field conjugate plane of the objective lens.

17. A method for providing an actinic illumination at an image plane comprising:
   a) forming an actinic illumination beam by energizing two or more light-emitting diodes within each of a plurality of compound parabolic concentrators and directing the actinic illumination beam through a condenser element and through one or more lens elements in a lens array;
   b) adjusting the angular irradiance of the actinic illumination beam by adjusting the emission intensity of at least one of the two or more light-emitting diodes within each of the plurality of compound parabolic concentrators; and
   c) directing the actinic illumination beam toward the image plane.

* * * * *